United States Patent [19]
Alessandri et al.

[11] Patent Number: 5,611,389
[45] Date of Patent: Mar. 18, 1997

[54] PROCEDURE FOR THE FABRICATION OF CRYSTALLINE BLADES

[75] Inventors: Martial G. Alessandri, La Ville Du Bois; Jean-Marc Theret, Evry, both of France

[73] Assignee: Societe Nationale d'Etude et de Construction de Moterus D'Aviation S.N.E.C.M.A., Paris Cedex, France

[21] Appl. No.: 340,465

[22] Filed: Dec. 30, 1981

[30] Foreign Application Priority Data

Dec. 30, 1980 [FR] France .................. 80 27789

[51] Int. Cl.$^6$ .................................. B22D 25/00
[52] U.S. Cl. .......................... 164/122.2; 164/361
[58] Field of Search ................ 164/122.2, 361; 156/608, 616 R

[56] References Cited

U.S. PATENT DOCUMENTS

| | | | |
|---|---|---|---|
| 3,598,169 | 8/1971 | Copley | 156/616 |
| 3,677,835 | 7/1972 | Tien et al. | 156/616 |
| 4,240,495 | 12/1980 | Vonnegut | 164/122.2 |

OTHER PUBLICATIONS

Mayfield, "Single Crystal Technology Use Starting", Aviation Week Oct. 1, 1979 pp. 69–73.

*Primary Examiner*—Charles T. Jordan
*Assistant Examiner*—John R. Hardee
*Attorney, Agent, or Firm*—Bacon & Thomas

[57] ABSTRACT

The method for the fabrication of a crystalline blade comprised of two shoulders enclosing an airfoil form which comprises arranging the shells of a mold in a manner such that the shoulders are parallel to the plane of a grain selection baffle that empties into a junction that moves the grain to the two shoulders, and feeding the mold through gates at the upper ends of the shoulders.

9 Claims, 2 Drawing Sheets

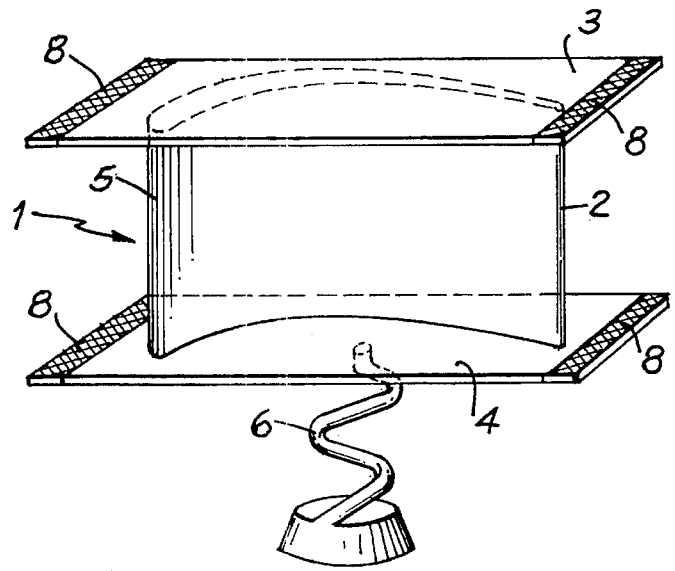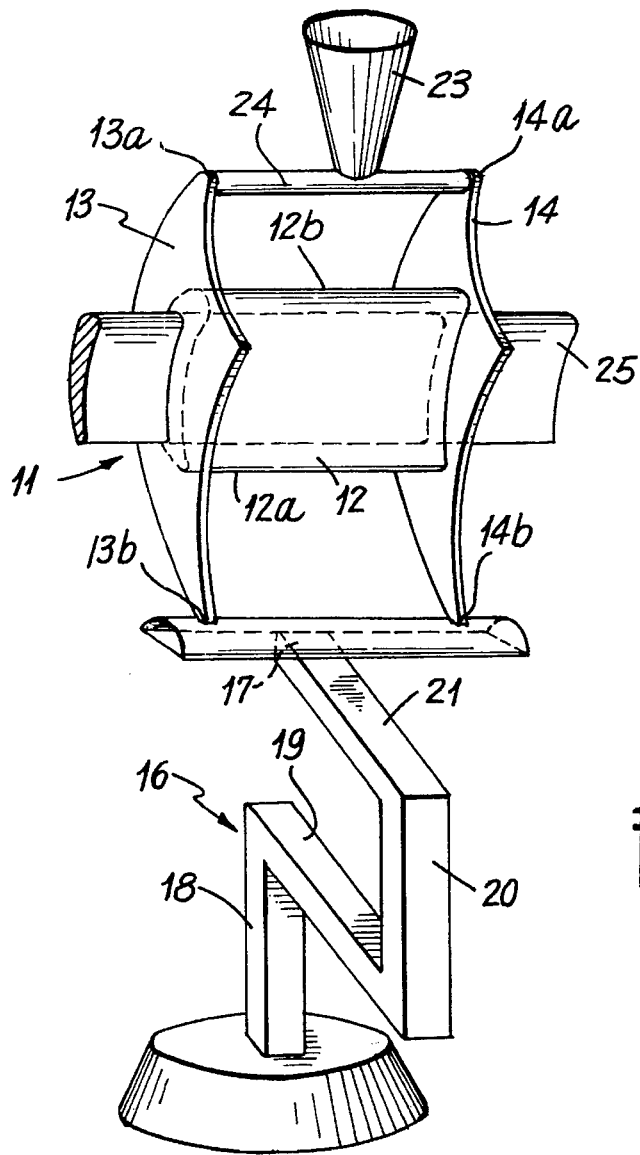

PROCEDURE FOR THE FABRICATION OF CRYSTALLINE BLADES

BACKGROUND OF THE INVENTION

The present invention concerns a procedure for the fabrication in a shell mold of a cast monocrystalline blade with a cubic structure comprised of one, or of several cylindrical airfoil forms enclosed by at least two symmetrical shoulders perpendicular to the generatrices of the airfoil form, the procedure being of the type in accordance with which the molten metal is poured into the top of the mold. Controlled solidification, which progresses vertically from the bottom up, takes place. A single grain of the crystal is selected by a selection device placed in the lower part of the mold, and at the outlet of which there will be found a single grain with a predetermined orientation and with a [001] direction that merges with the vertical.

There are known procedures for the fabrication of monocrystalline parts, in particular as shown in French patents 1,481,366 and 2,037187. It is known that the formation of monocrystals supposes that several conditions have been met: obtaining of controlled solidification, and selection of a single grain in particular.

Controlled solidification consists in causing the growth of "nuclei" in a molten metal bath in a given direction while at the same time avoiding the appearance of new nuclei by controlling the thermal gradient and the solidification rate. This is brought about by various devices, such as rows of burners with controlled extinction for heating purposes, a screen with a high thermal gradient extending along the mold, or other devices. The part thus obtained has a columnar structure that gives it favorable mechanical strength. Means making it possible to control grain progression, and the rate at which the front solidifies, have been the subject of numerous-inventions, and, in particular, of French Patent No. 78 19567.

Selection of a single grain is obtained in a known fashion by favoring the growth of grains that are favorably oriented at the expense of others. A grain selection device with a helicoidal baffle that makes it possible to obtain a single grain at the outlet from the baffle is described in the article titled "Single Crystal Technology Use Starting", that appeared in Aviation Week, 1 October 1979, pages 69 to 73, but this device does not ensure control of secondary orientation.

When one applies the conventional procedure of the type above to the fabrication of wide chord fixed blades for a turbine nozzle group comprised of a hollow airfoil form between two shoulders, one disposes the axes of these blades vertically in shell molds in order to avoid the joints of transverse grains.

The parts are clustered, but the importance of the shoulders limits considerably the number of blades per cluster.

On the other hand, an examination of large chord blades obtained in accordance With this method shows that the shoulders present an equi-axis structure in the transition zones located at their extremities. In point of fact, because the shoulders are placed perpendicular to the gradient, this placement results in the germination, in the shoulder, of grains that grow with the thickness. The shoulders, upon solidification, have numerous micropipes. These micropipes are due to the fact that by the end of the pouring process the molten metal reaching the ends of the shoulders is unable to force its way between the secondary dendrites to feed solidification shrinkage.

SUMMARY OF THE INVENTION

One object of the invention is to produce monocrystalline blades without the inconvenience noted above.

More particularly, the object of the invention is a method making it possible to obtain blades that are entirely monocrystalline (airfoil forms and shoulders) and to eliminate porosities and micropipes in the shoulders.

Another object of the invention is to provide a method for the fabrication of a multiplicity of blades making possible an advantageous disposition of the blades in a fabrication cluster, and in this way reduce fabrication time and costs.

These goals are reached by the method described and is characterized by the fact that shell molds are arranged such that the shoulders are oriented in a plane parallel to the direction of the monocrystal selected by the grain selection device, by the fact that the outlet of the grain selection device is caused to empty between the two shoulders into a junction that connects the selection device to the lower ends of the shoulders, and by the fact that the molten metal is poured into the mold at the level of the upper ends of the shoulders.

It is understood that the concepts of verticality and horizontality are relative in this context, and that in fact what is meant by verticality is directions that coincide with the propagation of the solidification front and the growth of the monocrystal selected by the selection device.

The monocrystal selected by the selection device has horizontal directions which are fixed by the aforesaid device, such that this device makes possible the extinction of grains the orientation of which is different from the orientation predetermined by the structure of the device.

The grain selection device has the advantage of being a baffle. In accordance with one characteristic of the invention, what is used is a baffle comprised of a succession of straight passages arranged in the same vertical plane and perpendicular to each other, the last emptying into the junction.

More particularly, the device comprises at least one vertical passage and one horizontal passage such that one can be certain that a correctly oriented monocrystal will be present at the outlet of the baffle. Its axis is vertical, and another direction is horizontal and in the plane of the baffle.

More particularly, the junction can be shaped like a T, Y, V, a prism, a small bar, or a solid triangle.

Because of the respective dimensions of the airfoil form and of the shoulders, more blades can be poured in the same cluster by arranging the parts in the cluster in accordance with the method of the invention, the horizontal space occupied by an airfoil form thus arranged being less than the horizontal space occupied by a shoulder arranged in accordance with one method of the previous state of the art.

In addition, the device in accordance with the invention makes it possible to very easily place the core used to make a hollow airfoil form in the pattern slot within the walls of the mold, and this ensures that the core will be held in place during pouring.

A very interesting advantage of the procedure is that a macrophotographic examination reveals the orientation of the primary dendrites, so it is possible in this way to slow down the fabrication of a monocrystalline blade.

BRIEF DESCRIPTION OF THE DRAWINGS

The advantages and characteristics of the invention will be better understood from the description which follows by referring to the attached drawings, in which:

FIG. 1 is a perspective view of a shouldered blade poured in accordance with the method of the previous state of the art;

FIG. 2 is a perspective view of a blade with a hollow airfoil form and monocrystalline shoulders poured in accordance with the method of the present invention;

In order to simplify the illustration, the same figure, which represents the mold-molded part interface, is supposed to represent the mold used for the part, and the part molded, while retaining the same designations for the corresponding parts of both.

DESCRIPTION OF THE PREFERRED EMBODIMENTS

Figure 3:
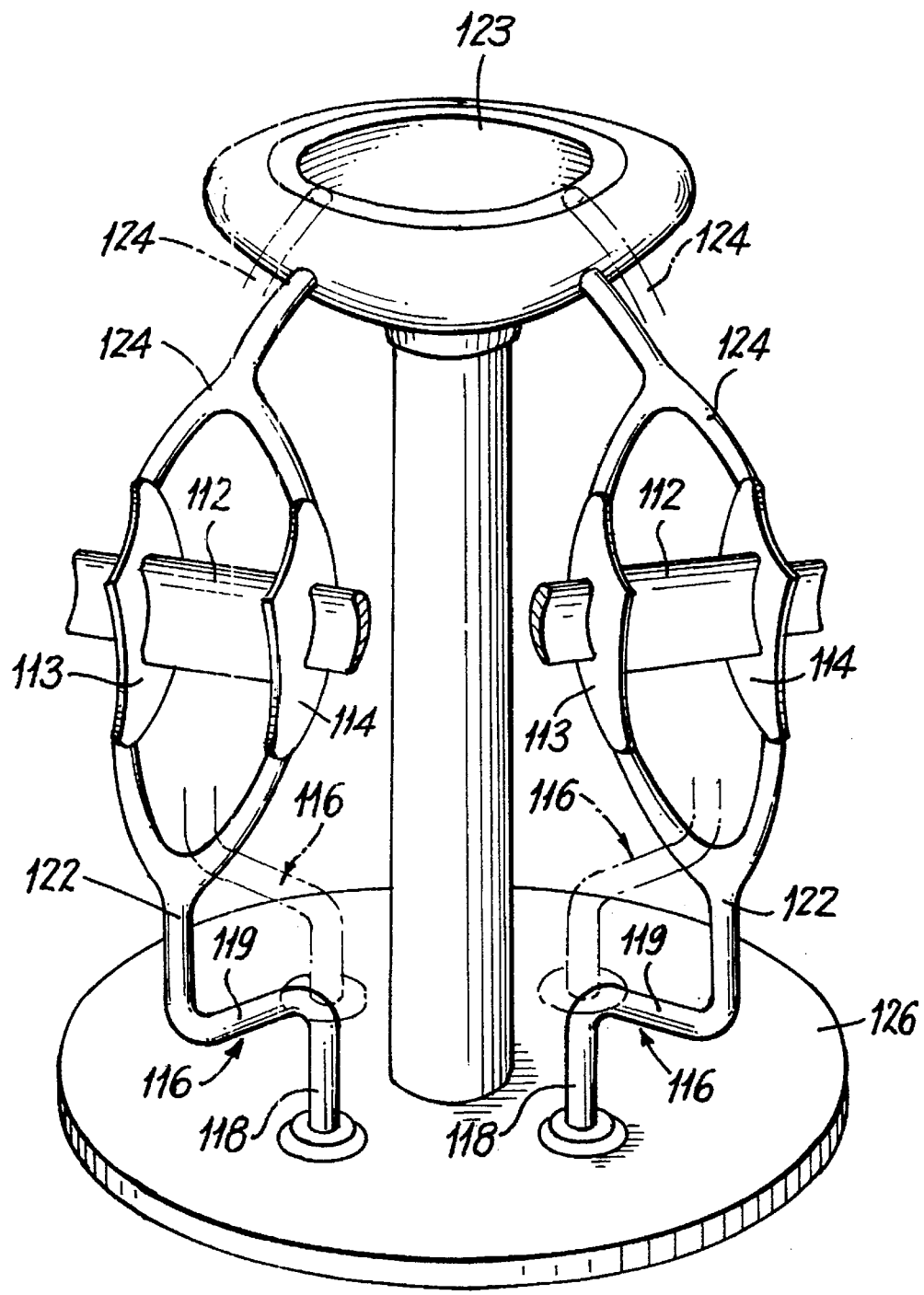
FIG. 3 is a view of an arrangement conforming to the present invention in the form of a cluster of four parts, only two of which are shown to provide better clarity.

FIG. 1 shows a blade 1 composed of an airfoil form 2 and two shoulders 3 and 4 symmetrical and perpendicular to the generatrices 5 of the airfoil form. A grain selection device 6 comprised, for example, of a helical baffle, makes it possible to obtain a single grain of crystal with the orientation selected at the vertically oriented outlet 7.

It will be noted that in accordance with this procedure of the previous state of the art, shoulders 3 and 4 are arranged horizontally.

In accordance with the invention, and as illustrated in FIG. 2, the parts in the cluster are arranged in a manner such that shoulders 13 and 14 enclosing airfoil form 12 of blade 11 are vertical, and in a manner such that the generatrices, such as 12a and 12b, of the airfoil form are parallel to one of the horizontal edges [010] or [100] of the crystal selected by the grain selection device.

The grain selection device shown at 16 is of the baffle type and comprises a succession of straight passages 18, 19, 20, 21, arranged so as to be perpendicular to each other in the same vertical plane parallel to shoulders 13 and 14.

It is known that the rate at which the grains grow in the case of a face-centered cubic crystalline system is not equal in all directions. The grains develop much more rapidly on the [001], [010], [100] axes than on the [110], [101], [011], and, a fortiori, the [111] axes.

These inequalities in the rate at which the grains propagate act as a kind of natural selection that eliminates some at the expense of others; the grains that develop in the <110> and <111> directions are quickly extinguished by those in the <001> direction which is normal to the solidification front.

So by arranging the baffle such that the first straight passage 18 is vertical (and where grains of vertical direction [001] will develop), the second 19 is horizontal (where grains of direction [100] parallel to the aforesaid passage will develop), then a third 20, in a new vertical direction, and a fourth 21, parallel to the second, one is practically assured of being in the presence of a monocrystal correctly oriented, and the [100] direction, which at the outlet of the baffle is near the vertical plane of the baffle.

The grain selection device empties at 17 into junction 22, here shown in the form of a small tube, which carries the grain selected to the lower ends, 13b and 14b, of shoulders 13 and 14, from whence it moves until it arrives at airfoil form 12.

Special precautions always are in order if one wishes to avoid the formation of joints of transverse grains in the plane of the chord, because these joints are unfavorable to the holding of the part. For this, baffle 16, or in a more general way, the grain selection device, empties at its outlet 17 into junction 22, leading the grain to the two shoulders 13 and 14 and permitting the aforesaid grain selected to grow simultaneously in the two shoulders 13 and 14 of the blade. This is indispensable. Otherwise, the result would be the appearance of an uncontrolled parasite grain in the unconnected shoulder, something that would result in the formation of a joint of grains oriented transversely in the airfoil form.

Junction 22 in FIG. 2 is a small tube arranged parallel to generatrices 12a and 12b of the airfoil form, but the junction can have any other shape that will be compatible with progression toward the top of the solidification front.

The molten metal is poured into the molds through two gates located at the upper corners, 13a and 14a, of shoulders 13 and 14, using a common feed 23, for example, separated by a distributor 24 in the form of a small tube or the like.

According to the method of the invention applied to the fabrication of hollow airfoil forms, it is particularly easy to hold the core 25, the purpose of which is to mold the hollow part of the blade, centered in the airfoil form. The ends of the core are enclosed in the shell of the mold for this purpose.

FIG. 3 shows the advantageous arrangement of a cluster that can be obtained in conformity with the invention. Four parts are symmetrically spaced; shoulders 113 and 114 of each airfoil form 112 are poured through a metal entrance 123 and a distributor 124 (here an inverted Y). Solidification of the metal progresses from base 126 resting on a cooled furnace hearth (not shown). A grain selection device 116 with a vertical passage 118 and a horizontal passage 119 empties into a Y-shaped junction 122, bringing the grain to shoulders 113 and 114.

A silica column, used for structural reinforcement, is connected to base 126 and, if required, adhered to one end of each core to help hold the core.

It will be understood that the method of the invention is not limited just to the forms described. They have been shown for purposes of illustration only, but are included in the framework defined by the following claims.

What is claimed is:

1. In the method of fabricating, in a shell mold, a monocrystalline cast blade with a cubic structure and comprised of an airfoil form (12) enclosed by two symmetrical shoulders (13, 14) perpendicular to the generatrices (12a and 12b) of the airfoil form, the method being one in which the molten metal is poured into the mold at its upper part, resulting in controlled solidification, the front of which progresses vertically from the bottom up, a single grain of crystal being selected by a selection device (16) located in the lower part of the mold, and at the outlet of which is found a single grain with a predetermined orientation and [001] direction that merges with the vertical; the improvement comprising the fact that the shells of the mold are arranged such that the shoulders (13, 14) are oriented in a plane parallel to the [001] direction of the monocrystal selected and by the fact that the generatrices (12a and 12b) of the airfoil form (12) are parallel to one of the horizontal directions [010] and [100] of the monocrystal selected by the grain selection device (16), and by the fact that an outlet (17) of the grain selection device (16) is caused to empty between the two shoulders (13, 14) into a juntion (22) connecting the selection device (16) to the lower ends (13b, 14b) of the shoulders (13, 14), and by the fact that the molten metal is poured into the mold at the level of the upper ends (13, 14) of the shoulders (13, 14).

2. A fabrication method in accordance with claim 1, characterized by the fact that a baffle is used as the grain selection device (16).

3. A fabrication procedure in accordance with claim 2, characterized by the fact that said baffle (16) is defined by a succession of straight passages (18, 19k 20, 21) arranged in the same vertical plane perpendicular each other and the last passage (21) of which empties into a junction (22).

4. A fabrication method in accordance with claim 3, characterized by the fact that the succession of straight passages comprises at least one vertical passage (18) and one horizontal passage (19).

5. A fabrication method in accordance with claim 3 characterized by the fact that the junction (22), (122) is of a shape selected from a T, a Y, a V, a prism, a solid triangle, or a small tube.

6. A fabrication method in accordance with claim 3 wherein the junction is a small tube arranged parallel to the generatrices (12a, 12b) of the airfoil form (12).

7. A fabrication method in accordance with claim 1 characterized by the fact that the upper ends (13a and 14a) of the shoulders of the blades are fed through a small distribution tube (24).

8. A method for the fabrication of a blade as defined in claim 1 and wherein a hollow airfoil is formed by using a core (25) which is enclosed in the walls of a shell.

9. A method for the fabrication of a multiplicity of blades in accordance with the method described in claim 1 characterized by the fact that the blades (112) are arranged so as to be cast in a cluster.

* * * * *